(12) United States Patent
Kim et al.

(10) Patent No.: US 12,374,299 B2
(45) Date of Patent: Jul. 29, 2025

(54) DISPLAY DEVICE AND METHOD OF DRIVING THE SAME

(71) Applicant: Samsung Display Co., LTD., Yongin-si (KR)

(72) Inventors: Jonghee Kim, Yongin-si (KR); Bogyeong Kim, Seongnam-si (KR); Tak-Young Lee, Anyang-si (KR); Boyong Chung, Suwon-si (KR); Byungseok Choi, Seoul (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 18/132,377

(22) Filed: Apr. 8, 2023

(65) Prior Publication Data
US 2024/0005879 A1 Jan. 4, 2024

(30) Foreign Application Priority Data

Jun. 29, 2022 (KR) .................. 10-2022-0079657

(51) Int. Cl.
*G09G 3/3291* (2016.01)
*G09G 3/3266* (2016.01)

(52) U.S. Cl.
CPC ......... *G09G 3/3291* (2013.01); *G09G 3/3266* (2013.01); *G09G 2310/08* (2013.01); *G09G 2330/021* (2013.01)

(58) Field of Classification Search
CPC .............. G09G 3/3291; G09G 3/3266; G09G 2310/08; G09G 2330/021
See application file for complete search history.

(56) References Cited

U.S. PATENT DOCUMENTS

| 9,734,800 B2 | 8/2017 | Han et al. | |
| 11,049,459 B2 | 6/2021 | Kim | |
| 2015/0243226 A1* | 8/2015 | Kumeta | G09G 3/3233 345/207 |
| 2019/0189056 A1* | 6/2019 | Gai | G09G 3/3233 |
| 2020/0051496 A1* | 2/2020 | Kang | G09G 3/3275 |
| 2020/0219451 A1* | 7/2020 | Kim | G09G 3/3266 |
| 2021/0005145 A1* | 1/2021 | Lee | G09G 3/3266 |
| 2021/0020102 A1* | 1/2021 | Yamamoto | G09G 3/3233 |
| 2021/0043717 A1* | 2/2021 | Park | G09G 3/20 |
| 2021/0375207 A1* | 12/2021 | Chen | G09G 3/3233 |
| 2022/0036818 A1* | 2/2022 | Yin | G09G 3/3233 |
| 2023/0215382 A1* | 7/2023 | Hong | G09G 3/3233 345/214 |

* cited by examiner

*Primary Examiner* — Md Saiful A Siddiqui
(74) *Attorney, Agent, or Firm* — CANTOR COLBURN LLP

(57) ABSTRACT

A display device includes a display panel including pixels, a gate driver applying gate signals to the pixels, a data driver applying data voltages to the pixels, sensing selected pixels among the pixels, and applying the data voltages to the selected pixels after the selected pixels are sensed in one frame, and a timing controller controlling the gate driver and the data driver.

20 Claims, 10 Drawing Sheets

DISPLAY DEVICE AND METHOD OF DRIVING THE SAME

This application claims priority to Korean Patent Application No. 10-2022-0079657, filed on Jun. 29, 2022, and all the benefits accruing therefrom under 35 U.S.C. § 119, the content of which in its entirety is herein incorporated by reference.

BACKGROUND

1. Field

Embodiments of the inventive concept relate to a display device and a method of driving the display device. More particularly, embodiments of the inventive concept relate to a display device sensing pixels.

2. Description of the Related Art

Generally, a display device may include a display panel, a timing controller, a gate driver, and a data driver. The display panel may include a plurality of gate lines, a plurality of data lines, and a plurality of pixels electrically connected to the gate lines and the data lines. The gate driver may provide gate signals to the gate lines, respectively. The data driver may provide data voltages to the data lines, respectively. The timing controller may control the gate driver and the data driver.

In the display device, differences in characteristics such as a threshold voltage and a mobility of a driving transistor and capacitance of a light-emitting element may occur for each of pixels due to process variations. Accordingly, compensation of data voltage applied to the pixel (i.e., compensation of input image data) may be performed to increase display quality.

SUMMARY

Embodiments of the inventive concept provide a display device that performs a sensing operation on sensed pixels and performs an initial data writing operation on the sensed pixels.

Embodiments of the inventive concept also provide a method of driving the display device.

In an embodiment of the inventive concept, a display device may include a display panel including pixels, a gate driver which apples gate signals to the pixels, a data driver which applies data voltages to the pixels, senses selected pixels among the pixels, and applies the data voltages to the selected pixels after the selected pixels are sensed in one frame, and a timing controller which controls the gate driver and the data driver.

In an embodiment, the data driver may not apply the data voltages to the selected pixels before the selected pixels are sensed in the one frame.

In an embodiment, in a first period of the one frame, the data driver may apply the data voltages to the pixels, sense the selected pixels, and apply the data voltages to the selected pixels after the selected pixels are sensed, and, in a second period of the one frame after the first period, the data driver may not apply the data voltages to the pixels.

In an embodiment, the data driver may apply a reference voltage to the selected pixels, generate sensing currents in the selected pixels, and receive the sensing currents, and sense the selected pixels.

In an embodiment, the gate signals may include a scan signal and a sensing signal, and each of the pixels may include a driving transistor including a control electrode connected to a first node, a first electrode which receives a first power voltage, and a second electrode connected to a second node, a first transistor including a control electrode which receives the scan signal, a first electrode connected to a data line, and a second electrode connected to the first node, a second transistor including a control electrode which receives the sensing signal, a first electrode connected to the second node, and a second electrode connected to a sensing line, a storage capacitor including a first electrode connected to the first node and a second electrode connected to the second node, and a light-emitting element including a first electrode connected to the second node and a second electrode which receives a second power voltage.

In an embodiment, in a sensing period in which the selected pixels are sensed, the scan signal and the sensing signal may have a gate-on level, and the reference voltage may be applied to the data line, and, in a sensing pixel data writing period in which the data voltages are applied to the selected pixels, the scan signal and the sensing signal may have the gate-on level, and the data voltages may be applied to the data line.

In an embodiment, the gate signals may include a scan signal and a sensing signal, the gate driver may include a plurality of stages, and each of the plurality of stages may output a carry clock signal as a carry signal in response to a previous carry signal, to output a scan clock signal as the scan signal in response to the previous carry signal, and to output a sensing clock signal as the sensing signal in response to the previous carry signal.

In an embodiment, a N-th stage, where N is a positive integer, among the plurality of stages may generate the scan signal and the sensing signal applied to the selected pixels, in a sensing period in which the selected pixels are sensed, the scan clock signal applied to the N-th stage and the sensing clock signal applied to the N-th stage may have a gate-on level, and the carry clock signal applied to the N-th stage may have a gate-off level, and, in a sensing pixel data writing period in which the data voltages are applied to the selected pixels, the scan clock signal applied to the N-th stage, the sensing clock signal applied to the N-th stage, and the carry clock signal applied to the N-th stage may have the gate-on level.

In an embodiment, each of the plurality of stages may include a first input part which controls a voltage of a third node in response to the previous carry signal, a second input part which controls the voltage of the third node in response to a first next carry signal, a first output part which outputs the carry clock signal as the carry signal in response to the voltage of the third node, a second output part which outputs the scan clock signal as the scan signal in response to the voltage of the third node, and a third output part which outputs the sensing clock signal as the sensing signal in response to the voltage of the third node.

In an embodiment of the inventive concept, the display device may include a display panel including pixels, a gate driver which applies gate signals to the pixels, a data driver which applies data voltages to the pixels, senses the pixels of a selected pixel line among pixel lines including the pixels, and applies the data voltages to the pixels of the selected pixel line after the pixels of the selected pixel line are sensed in one frame, and a timing controller which controls the gate driver and the data driver.

In an embodiment, the data driver may not apply the data voltages to the pixels of the selected pixel line before the pixels of the selected pixel line are sensed in the one frame.

In an embodiment, in a first period of the one frame, the data driver may apply the data voltages to the pixels, sense the pixels of the selected pixel line, and apply the data voltages to the pixels of the selected pixel line after the pixels of the selected pixel line are sensed, and, in a second period of the one frame after the first period, the data driver may not apply the data voltages to the pixels.

In an embodiment, the data driver may apply a reference voltage to the pixels of the selected pixel line, generate sensing currents in the pixels of the selected pixel line, and receive the sensing currents to sense the pixels of the selected pixel line.

In an embodiment, the gate signals may include a scan signal and a sensing signal, and each of the pixels may include a driving transistor including a control electrode connected to a first node, a first electrode which receives a first power voltage, and a second electrode connected to a second node, a first transistor including a control electrode which receives the scan signal, a first electrode connected to a data line, and a second electrode connected to the first node, a second transistor including a control electrode which receives the sensing signal, a first electrode connected to the second node, and a second electrode connected to a sensing line, a storage capacitor including a first electrode connected to the first node and a second electrode connected to the second node, and a light-emitting element including a first electrode connected to the second node and a second electrode which receives a second power voltage.

In an embodiment, in a sensing period in which the pixels of the selected pixel line are sensed, the scan signal and the sensing signal may have a gate-on level, and the reference voltage may be applied to the data line, and, in a sensing pixel data writing period in which the data voltages are applied to the pixels of the selected pixel line, the scan signal and the sensing signal have the gate-on level, and the data voltages may be applied to the data line.

In an embodiment, the gate signals may include a scan signal and a sensing signal, the gate driver may include a plurality of stages, and each of the plurality of stages may output a carry clock signal as a carry signal in response to a previous carry signal, output a scan clock signal as the scan signal in response to the previous carry signal, and output a sensing clock signal as the sensing signal in response to the previous carry signal.

In an embodiment, a N-th stage, where N is a positive integer, among the plurality of stages may generate the scan signal and the sensing signal applied to the pixels of the selected pixel line, in a sensing period in which the pixels of the selected pixel line are sensed, the scan clock signal applied to the N-th stage and the sensing clock signal applied to the N-th stage have a gate-on level, and the carry clock signal applied to the N-th stage may have a gate-off level, and, in a sensing pixel data writing period in which the data voltages are applied to the pixels of the selected pixel line, the scan clock signal applied to the N-th stage, the sensing clock signal applied to the N-th stage, and the carry clock signal applied to the N-th stage may have the gate-on level.

In an embodiment, each of the plurality of stages may include a first input part which controls a voltage of a third node in response to the previous carry signal, a second input part which controls the voltage of the third node in response to a first next carry signal, a first output part which outputs the carry clock signal as the carry signal in response to the voltage of the third node, a second output part which outputs the scan clock signal as the scan signal in response to the voltage of the third node, and a third output part which outputs the sensing clock signal as the sensing signal in response to the voltage of the third node.

By embodiments of the inventive concept, a method of driving a display device may include selecting at least one pixel line from among pixel lines including pixels, sequentially writing data voltages to the pixels of the pixel lines according to a preset order of the pixel lines, sensing the pixels of the selected pixel line in turn to write the data voltages to the pixels of the selected pixel line, writing the data voltages to the pixels of the selected pixel line, and sequentially writing the data voltages to the pixels of the pixel lines according to the order of the pixel lines again.

In an embodiment, the data voltages may be not apply to the pixels of the selected pixels line before the pixels of the selected pixel line are sensed in one frame.

Therefore, the display device may reduce the number of times of application of data voltages in one frame by sensing selected pixels among pixels, and applying data voltages to the selected pixels after the selected pixels are sensed in one frame.

In addition, the display device may include a gate driver without a separate sensing circuit by sensing pixels of a selected pixel line among pixel lines including the pixels, and applying data voltages to the pixels of the selected pixel line after the pixels of the selected pixel line are sensed in one frame. Accordingly, the display device may reduce dead space and reduce cost.

Further, the display device may sense a plurality of pixel lines in one frame.

Finally, the method of driving the display device may increase a emission time of pixels sensed in one frame by selecting at least one pixel line from among pixel lines including pixels, sequentially writing data voltages to the pixels of the pixel lines according to a preset order of the pixel lines, sensing the pixels of the selected pixel line in turn to write the data voltages to the pixels of the selected pixel line, writing the data voltages to the pixels of the selected pixel line, and sequentially writing the data voltages to the pixels of the pixel lines according to the order of the pixel lines again.

However, the effects of the inventive concept are not limited to the above-described effects, and may be variously expanded without departing from the spirit and scope of the inventive concept.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION OF THE INVENTIVE CONCEPT

Figure 1:
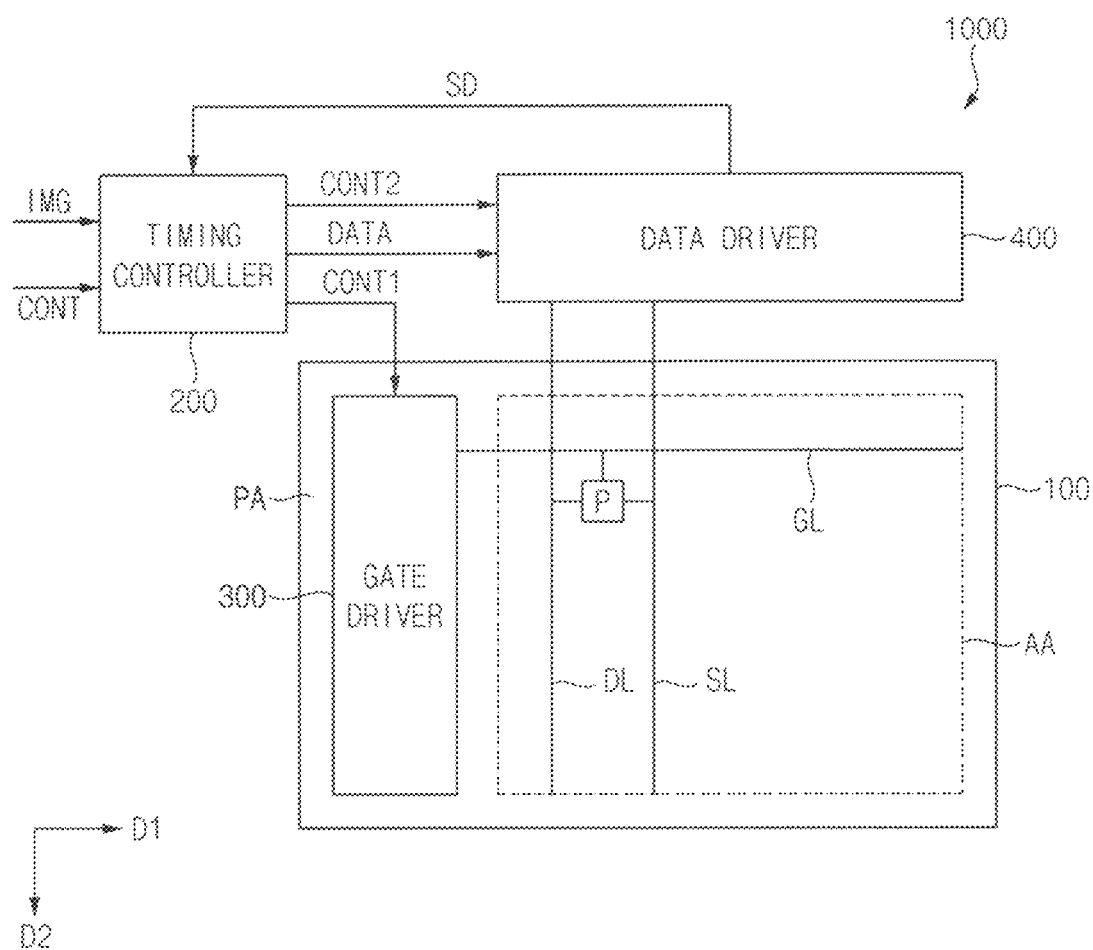
FIG. 1 is a block diagram illustrating a display device according to the inventive concept.

Hereinafter, the inventive concept will be explained in detail with reference to the accompanying drawings.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within ±30%, 20%, 10%, 5% of the stated value, for example.

The term "part" or "unit" as used herein is intended to mean a software component or a hardware component that performs a predetermined function. The hardware component may include a field-programmable gate array ("FPGA") or an application-specific integrated circuit ("ASIC"), for example. The software component may refer to an executable code and/or data used by the executable code in an addressable storage medium. Thus, the software components may be object-oriented software components, class components, and task components, and may include processes, functions, attributes, procedures, subroutines, segments of program code, drivers, firmware, micro codes, circuits, data, a database, data structures, tables, arrays, or variables, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a block diagram illustrating an embodiment of a display device 1000 according to the inventive concept.

Referring to FIG. 1, the display device 1000 may include a display panel 100, a timing controller 200, a gate driver 300, and a data driver 400. In an embodiment, the timing controller 200 and the data driver 400 may be integrated into one chip.

The display panel 100 has a display region AA on which an image is displayed and a peripheral region PA adjacent to the display region AA. In an embodiment, the gate driver 300 may be disposed (e.g., mounted) on the peripheral region PA of the display panel 100.

The display panel 100 may include a plurality of gate lines GL, a plurality of data lines DL, a plurality of sensing lines SL and a plurality of pixels P electrically connected to the data lines DL the gate lines GL, and the sensing lines SL. The gate lines GL may extend in a first direction D1 and the data lines DL may extend in a second direction D2 crossing the first direction D1.

The timing controller 200 may receive input image data IMG and an input control signal CONT from a host processor (e.g., a graphic processing unit ("GPU")). In an embodiment, the input image data IMG may include red image data, green image data and blue image data, for example. In an embodiment, the input image data IMG may further include white image data. In another embodiment, the input image data IMG may include magenta image data, yellow image data, and cyan image data, for example. The input control signal CONT may include a master clock signal and a data enable signal. The input control signal CONT may further include a vertical synchronizing signal and a horizontal synchronizing signal.

The timing controller 200 may generate a first control signal CONT1, a second control signal CONT2, and data signal DATA based on the input image data IMG and the input control signal CONT.

The timing controller 200 may generate the first control signal CONT1 for controlling operation of the gate driver 300 based on the input control signal CONT and output the first control signal CONT1 to the gate driver 300. The first control signal CONT1 may include a vertical start signal and a gate clock signal.

The timing controller 200 may generate the second control signal CONT2 for controlling operation of the data driver 400 based on the input control signal CONT and output the second control signal CONT2 to the data driver 400. The second control signal CONT2 may include a horizontal start signal and a load signal.

The timing controller 200 may receive the input image data IMG and the input control signal CONT, and generate the data signal DATA. The timing controller 200 may output the data signal DATA to the data driver 400.

The gate driver 300 may generate gate signals for driving the gate lines GL in response to the first control signal CONT1 input from the timing controller 200. In an embodiment, the gate signals may include a scan signal (SC in FIG. 2) and a sensing signal (SS in FIG. 2). The gate driver 300 may output the gate signals to the gate lines GL, for example. In an embodiment, the gate driver 300 may sequentially output the gate signals to the gate lines GL, for example.

The data driver 400 may receive the second control signal CONT2 and the data signal DATA from the timing controller 200. The data driver 400 may convert the data signal DATA into data voltages having an analog type. The data driver 400 may output the data voltages to the data lines DL.

The data driver 400 may generate sensing data SD by sensing the pixels P (e.g., sensing a threshold voltage and a mobility characteristic of a driving transistor of each of the pixels P). The data driver 400 may output the sensing data SD to the timing controller 200. The timing controller 200 may compensate for the input image data IMG based on the sensing data SD.

Figure 2:
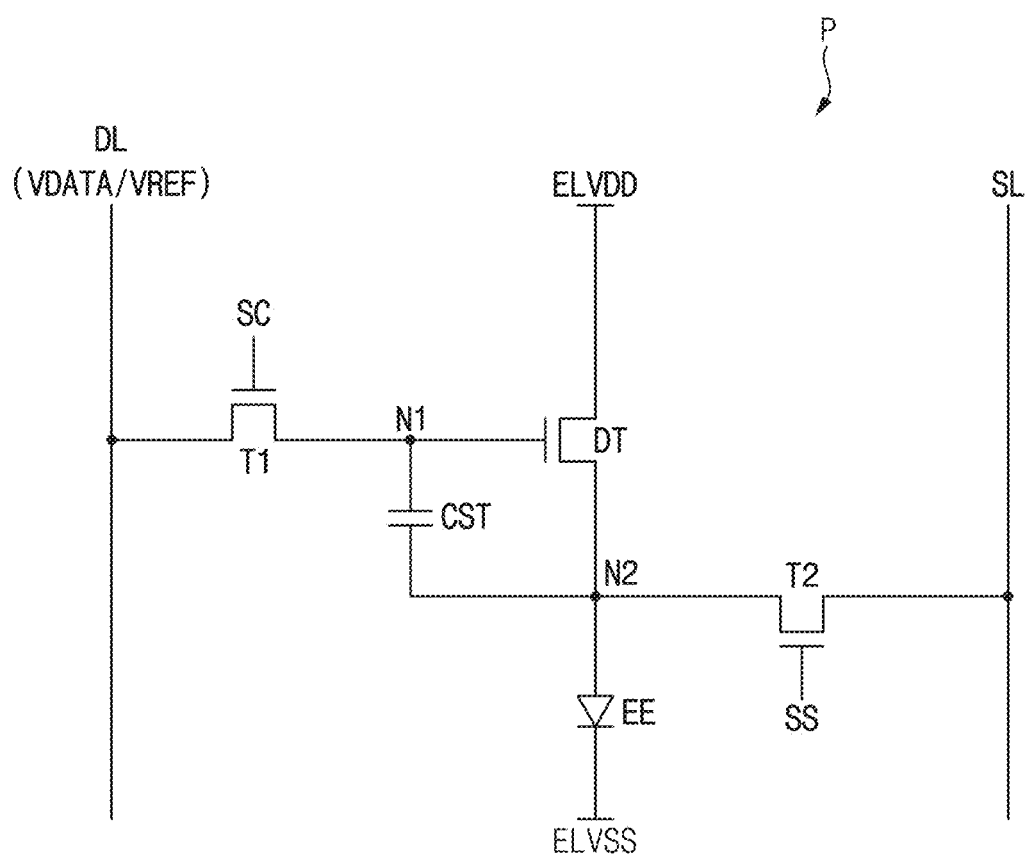
FIG. 2 is a circuit diagram illustrating an embodiment of a pixel of the display device of FIG. 1.

FIG. 2 is a circuit diagram illustrating an embodiment of the pixel P of the display device 1000 of FIG. 1.

Referring to FIG. 2, each of the pixels P may include a driving transistor DT including a control electrode connected to a first node N1, a first electrode receiving a first power voltage ELVDD (e.g., a high power voltage), and a second electrode connected to a second node N2, a first transistor T1 including a control electrode receiving the scan signal SC, a first electrode connected to the data line DL, and a second electrode connected to the first node N1, a second transistor T2 including a control electrode receiving the sensing signal SS, a first electrode connected to the second node N2, and a second electrode connected to the sensing line SL, a storage capacitor CST including a first electrode connected to the first node N1 and a second electrode connected to the second node N2, and a light-emitting element EE including a first electrode connected to the second node N2 and a second electrode receiving a second power voltage ELVSS (e.g., a low power voltage).

As shown in FIG. 2, the driving transistor DT, the first transistor T1, and the second transistor T2 may be n-type transistors. However, the pixels P in embodiments of the inventive concept are not limited thereto. In an embodiment, the driving transistor DT, the first transistor T1, and the second transistor T2 may be p-type transistors, for example.

Figure 3:
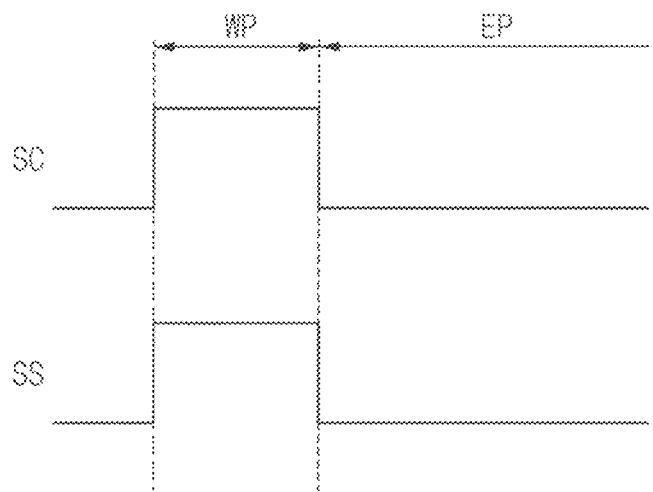
FIG. 3 is a timing diagram illustrating an embodiment in which the display device of FIG. 1 drives unselected pixels.
Figure 4:
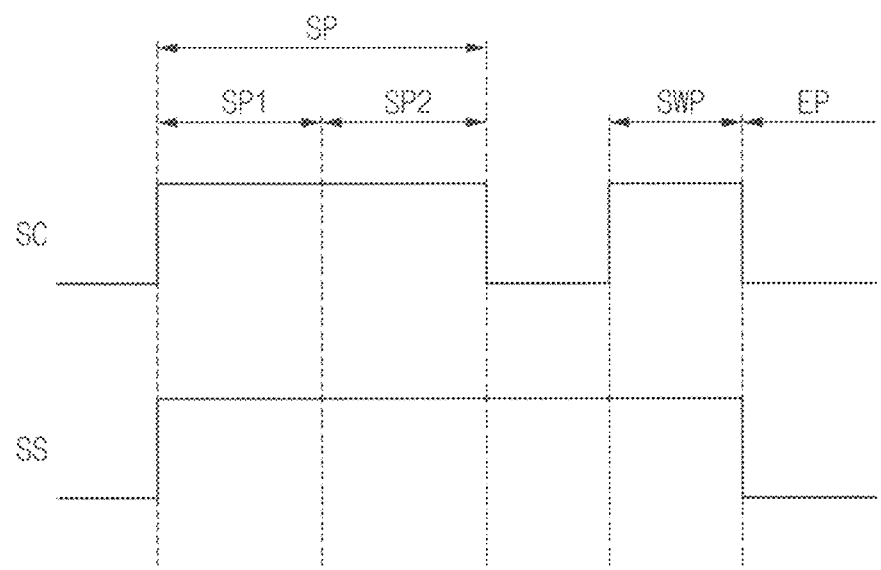
FIG. 4 is a timing diagram illustrating an embodiment in which the display device of FIG. 1 drives selected pixels.

FIG. 3 is a timing diagram illustrating an embodiment in which the display device 1000 of FIG. 1 drives unselected pixels, and FIG. 4 is a timing diagram illustrating an embodiment in which the display device 1000 of FIG. 1 drives selected pixels. FIGS. 3 and 4 show a gate-on level as a high voltage level and a gate-off level as a low voltage level.

Referring to FIGS. 1 to 4, the display device 1000 may select some of the pixels P. The display device 1000 may perform a data writing operation on the unselected pixels. The display device 1000 may perform a sensing operation and the data writing operation on the selected pixels.

In an embodiment, referring to FIGS. 2 and 3, in a data writing period WP in which the data voltages VDATA are applied to the unselected pixels, the scan signal SC and the sensing signal SS may have the gate-on level, and the first transistor T1 and the second transistor T2 may be turned on, for example. When the first transistor T1 is turned on, the data voltage VDATA may be written (i.e., the data writing operation) to the storage capacitor CST through the data line DL. When the second transistor T2 is turned on, an initialization voltage may be applied to the second node N2, and the first electrode of the light-emitting element EE may be initialized.

In an embodiment, in an emission period EP, the scan signal SC and the sensing signal SS may have the gate-off level, and the first transistor T1 and the second transistor T2 may be turned off, for example. When the first transistor T1 and the second transistor T2 are turned off, the driving transistor DT may generate a driving current corresponding to a voltage of the first node N1 (i.e., corresponding to the data voltage VDATA), and the light-emitting element EE may emit light due to the driving current.

The data driver 500 may apply a reference voltage VREF to the selected pixels to generate sensing currents in the selected pixels, and receive the sensing currents to sense the selected pixels.

In a sensing period SP in which the selected pixels are sensed, the scan signal SC and the sensing signal SS may have the gate-on level, and the reference voltage VREF may be applied to the data line DL, and, in a sensing pixel data writing period SWP in which the data voltages VDATA are applied to the selected pixels, the scan signal SC and the sensing signal SS may have the gate-on level, and the data voltages VDATA may be applied to the data line DL. In the emission period EP, the selected pixels and the unselected pixels may operate in the same manner.

In an embodiment, referring to FIGS. 2 and 4, in a first sensing period SP1, the scan signal SC and the sensing signal SS may have the gate-on level, and the first transistor T1 and the second transistor T2 may be turned on, and the initialization voltage may be applied to the second node N2, for example. When the first transistor T1 is turned on, the reference voltage VREF may be applied to the first node N1 through the data line DL. When the second transistor T2 is turned on, the initialization voltage may be applied to the second node N2, and the first electrode (i.e., an anode electrode) of the light-emitting element EE may be initialized.

In an embodiment, in a second sensing period SP2, the scan signal SC and the sensing signal SS may have the gate-on level, and the first transistor T1 and the second transistor T2 may be turned on, and the initialization voltage may not be applied to the second node N2, for example. The driving transistor DT may generate the sensing current corresponding to the voltage of the first node N1 (i.e., corresponding to the reference voltage VREF), and the data driver 500 may receive the sensing current through the sensing line SL (i.e., a sensing operation). The data driver 500 may generate the sensing data (SD in FIG. 1) based on the sensing current.

Figure 5:
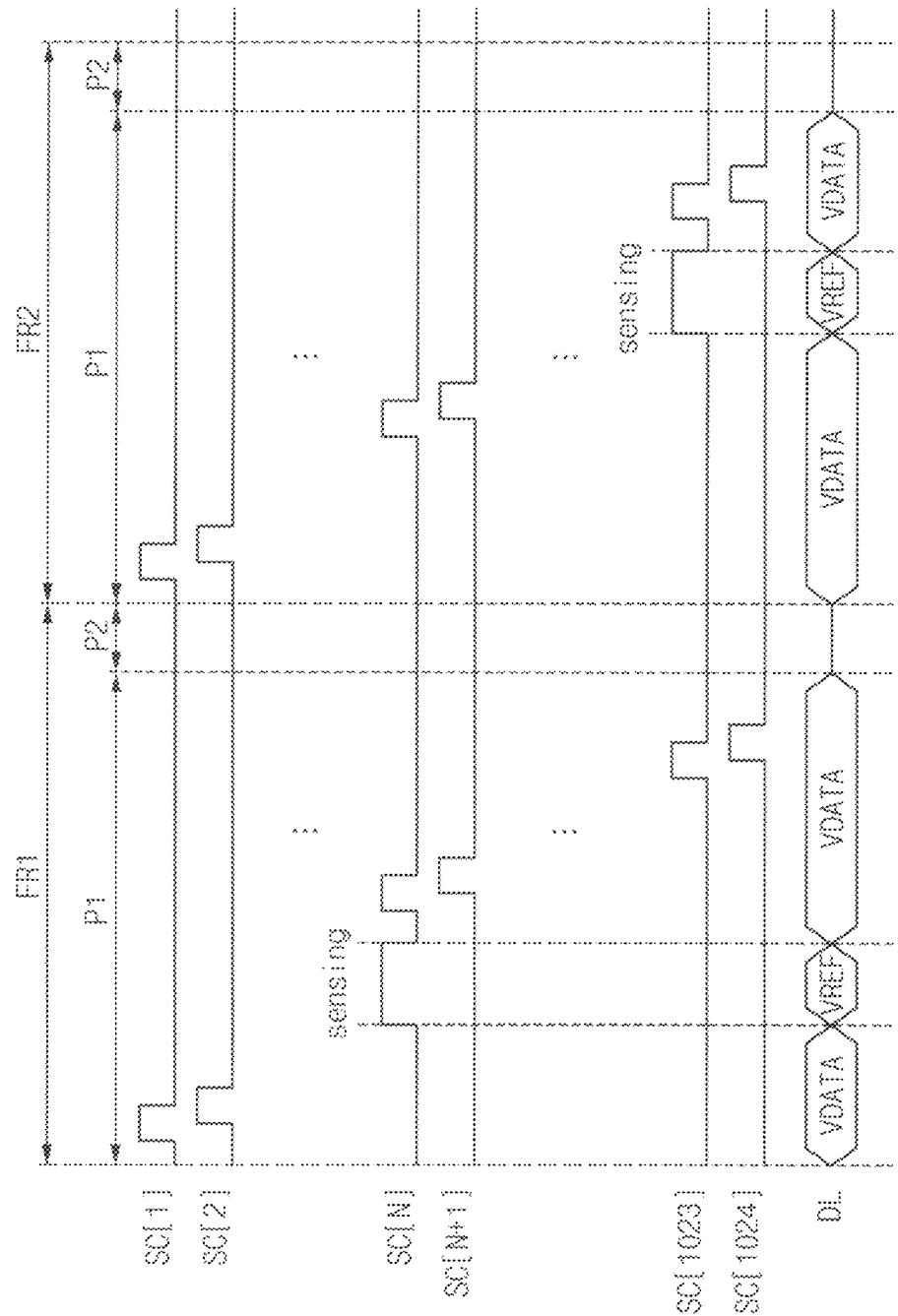
FIG. 5 is a diagram illustrating an embodiment of scan signals of the display device of FIG. 1.

FIG. 5 is a diagram illustrating an embodiment of the scan signals (SC[1], SC[2], . . . , SC[1024]) of the display device 1000 of FIG. 1. FIG. 5 shows that the display panel 100 includes 1024 pixel lines.

Referring to FIGS. 1 and 5, one pixel line may be connected to one gate line GL. In an embodiment, a pixel line may be a pixel row. The gate driver 300 may sequentially output the scan signals (SC[1], SC[2], . . . , SC[1024]) to the pixel lines according to an order of the pixel lines, for example. In response to the scan signals (SC[1], SC[2], . . . , SC[1024]), the data voltages VDATA may be sequentially written (i.e., writing to the storage capacitor (CST in FIG. 2)) to the pixels P of the pixel lines according to a preset order of the pixel lines.

The data driver 400 may sense the selected pixels among the pixels P, and apply the data voltages VDATA to the selected pixels after the selected pixels are sensed in one frame (e.g., first or second frame FR1 or FR2). The selected pixels may be the pixels P of a selected pixel line among the pixels lines.

The data driver 500 may not apply the data voltages VDATA to the selected pixels before the selected pixels are sensed in the one frame (e.g., first or second frame FR1 or FR2). That is, in one frame (e.g., first or second frame FR1 or FR2), after the sensing operation is performed on the selected pixels, an initial data writing operation (i.e., a data writing operation first performed in one frame (e.g., first or second frame FR1 or FR2)) may be performed on the selected pixels.

In a first period P1 of the one frame (e.g., first or second frame FR1 or FR2), the data driver 500 may apply the data voltages VDATA to the pixels P, sense the selected pixels, and apply the data voltage VDATA to the selected pixels after the selected pixels are sensed.

In an embodiment, it is assumed that the display device 1000 selects a N-th pixel line (i.e., the pixels P of the N-th pixel line are selected) in the first period P1 of the first frame FR1, for example. The scan signal SC[N] applied to the N-th pixel line may have the same waveform as that of FIG. 4. Accordingly, the data drive 400 may sense the pixels P of the N-th pixel line and apply data voltages VDATA to the pixels P of the N-th pixel line.

In a second period P2 of the one frame (e.g., first or second frame FR1 or FR2) after the first period P1, the data driver 500 may not apply the data voltages VDATA to the pixels P. In an embodiment, the second period P2 may be a period remaining until a next frame after the data voltages VDATA are applied to all the pixels P, for example.

In contrast, when the display device performs the data write operation (i.e., an initial data write operation) on the selected pixels in the first period P1 and performs the sensing operation on the selected pixels in the second period P2, the display device may be desired to perform the data write operation on the selected pixels again (i.e., a data rewrite operation) after the sensing operation in the second period P2. When the data write operation is performed again, it takes time for the data voltages VDATA to be charged in the storage capacitor (CST in FIG. 2) again, so that a emission time of the selected pixels may be reduced.

However, since the display device 1000 performs the sensing operation in the first period P1 and performs the data write operation after performing the sensing operation, the display device 1000 may reduce the number of times of application of the data voltages VDATA in the one frame (e.g., first or second frame FR1 or FR2), and increase the emission time of the selected pixels.

Figure 6:
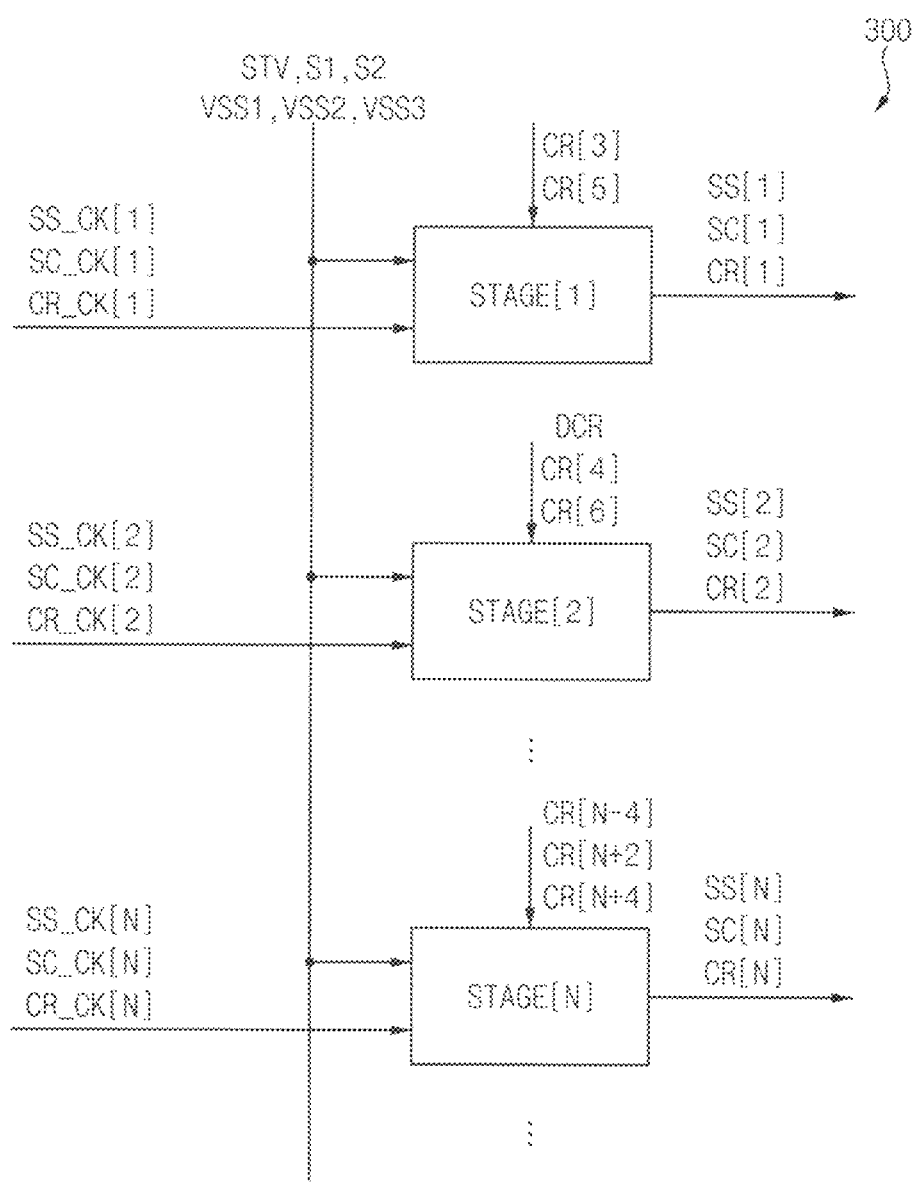
FIG. 6 is a diagram illustrating an embodiment of a gate driver of the display device of FIG. 1.

FIG. 6 is a diagram illustrating an embodiment of the gate driver 300 of the display device 1000 of FIG. 1.

Referring to FIG. 6, the gate driver 300 may include a plurality of stages (STAGE[1], STAGE[2], STAGE[N], . . . ). The gate signals may include the scan signal (SC[1], SC[2], . . . , SC[N], . . . ) and the sensing signal (SS[1], SS[2], . . . , SS[N], . . . ). Here, N is any positive integer.

Each of the stages (STAGE[1], STAGE[2], STAGE[N], . . . ) may output a carry clock signal (CR_CK[1], CR_CK[2], . . . , CR_CK[N], . . . ) as a carry signal (CR[1], CR[2], . . . , CR[N], . . . ) in response to a previous carry signal (e.g., CR[N−4] relative to the N-th stage STAGE[N]), output a scan clock signal (SC_CK[1], SC_CK[2], . . . , SC_CK[N], . . . ) as the scan signal (SC[1], SC[2], SC[N], . . . ) in response to the previous carry signal (e.g., CR[N−4] relative to the N-th stage STAGE[N]), and output a sensing clock signal (SS_CK[1], SS_CK[2], . . . , SS_CK[N], . . . ) as the sensing signal (SS[1], SS[2], . . . , SS[N], . . . ) in response to the previous carry signal (e.g., CR[N−4] relative to the N-th stage STAGE[N]).

The stages (STAGE[1], STAGE[2], STAGE[N], . . . ) may generate the scan signal (SC[1], SC[2], SC[N], . . . ) based on the scan clock signal (SC_CK[1], SC_CK[2], SC_CK[N], . . . ). In an embodiment, a first stage STAGE[1] may generate a first scan signal SC[1] based on a first scan clock signal SC_CK[1], for example. In an embodiment, a N-th stage STAGE[N] may generate a N-th scan signal SC[N] based on a N-th scan clock signal SC_CK[N], for example.

The stages (STAGE[1], STAGE[2], STAGE[N], . . . ) may generate the sensing signal (SS[1], SS[2], . . . , SS[N], . . . ) based on the sensing clock signal (SS_CK[1], SS_CK[2], SS_CK[N], . . . ). In an embodiment, the first stage STAGE[1] may generate a first sensing signal SS[1] based on a first sensing clock signal SC_CK[1], for example. In an embodiment, the N-th stage STAGE[N] may generate a N-th sensing signal SS[N] based on a N-th sensing clock signal SS_CK[N], for example.

The stages (STAGE[1], STAGE[2], STAGE[N], . . . ) may generate the carry signal (CR[1], CR[2], CR[N], . . . ) based on the carry clock signal (CR_CK[1], CR_CK[2], CR_CK[N], . . . ). In an embodiment, the first stage STAGE[1] may generate a first carry signal CR[1] based on a first carry clock signal CR_CK[1], for example. In an embodiment, a N-th stage STAGE[N] may generate a N-th carry signal CR[N] based on a N-th carry clock signal CR_CK[N], for example.

The stages (STAGE[1], STAGE[2], STAGE[N], . . . ) may generate the scan signal (SC[1], SC[2], SC[N], . . . ), the sensing signal (SS[1], SS[2], SS[N], . . . ), and the carry signal (CR[1], CR[2], . . . , CR[N], . . . ) based on a start signal STV, a first scan control signal S1, a second scan control signal S2, a first low power voltage VSS1, a second low power voltage VSS2, and a third low power voltage VSS3.

The stages (STAGE[1], STAGE[2], STAGE[N], . . . ) may generate the scan signal (SC[1], SC[2], . . . , SC[N], . . . ), the sensing signal (SS[1], SS[2], SS[N], . . . ), and the carry signal (CR[1], CR[2], CR[N], . . . ) based on the previous carry signals (e.g., CR[N−4] relative to the N-th stage STAGE[N]). The first stage STAGE[1] may generate the first scan signal SC[1], the first sensing signal SS[1], and the first carry signal CR[1] based on the start signal STV instead of the previous carry signal. However, stages (e.g., a second stage STAGE[2]) that cannot receive the previous carry signal except for the first stage (STAGE[1]) may generate the scan signal (e.g., SC[2]), the sensing signal (e.g., SS[2]), and the carry signal (e.g., CR[2]) based on a dummy carry signal DCR.

Figure 7:
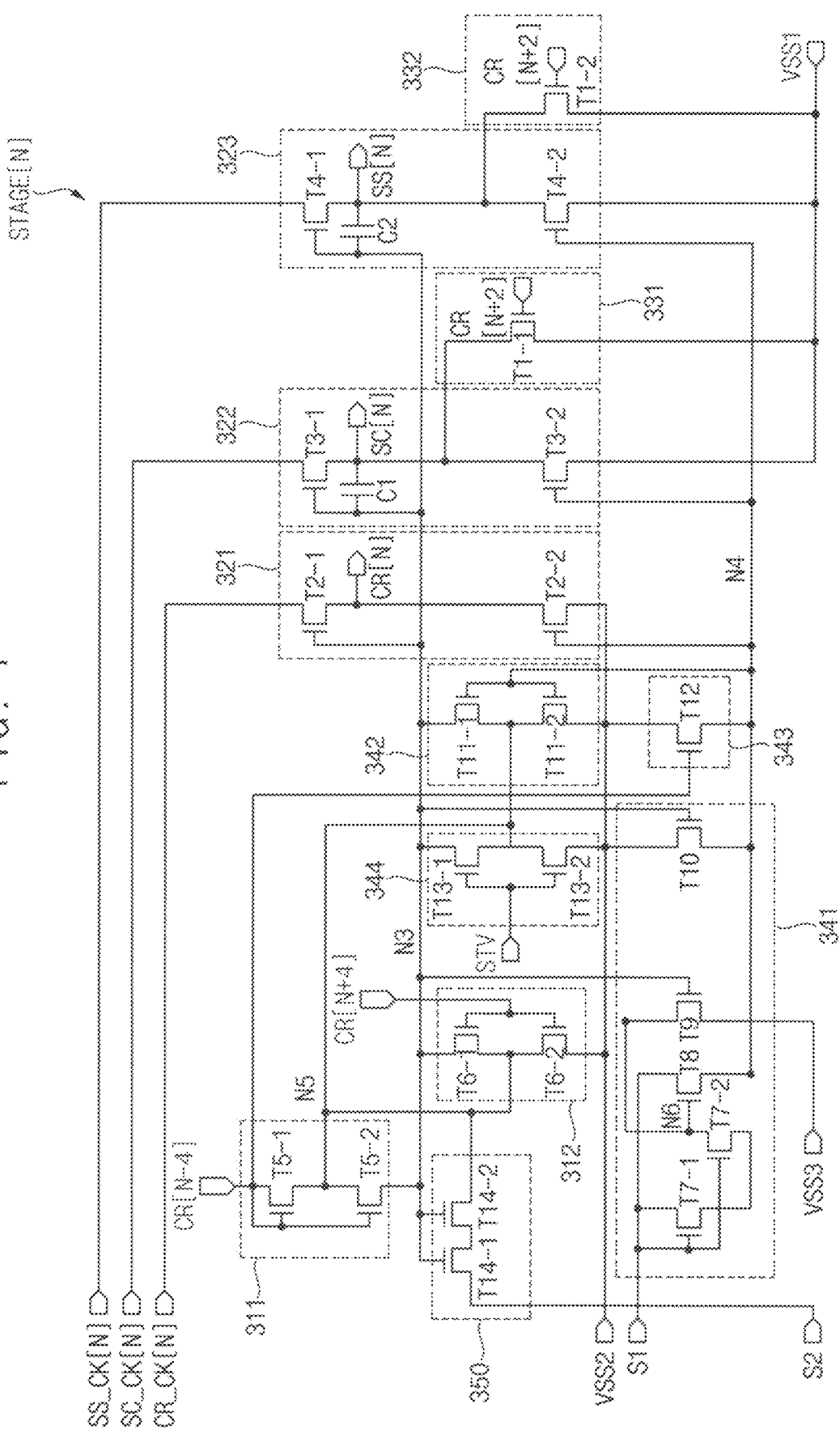
FIG. 7 is a diagram illustrating an embodiment of a stage of the display device of FIG. 1.
Figure 8:
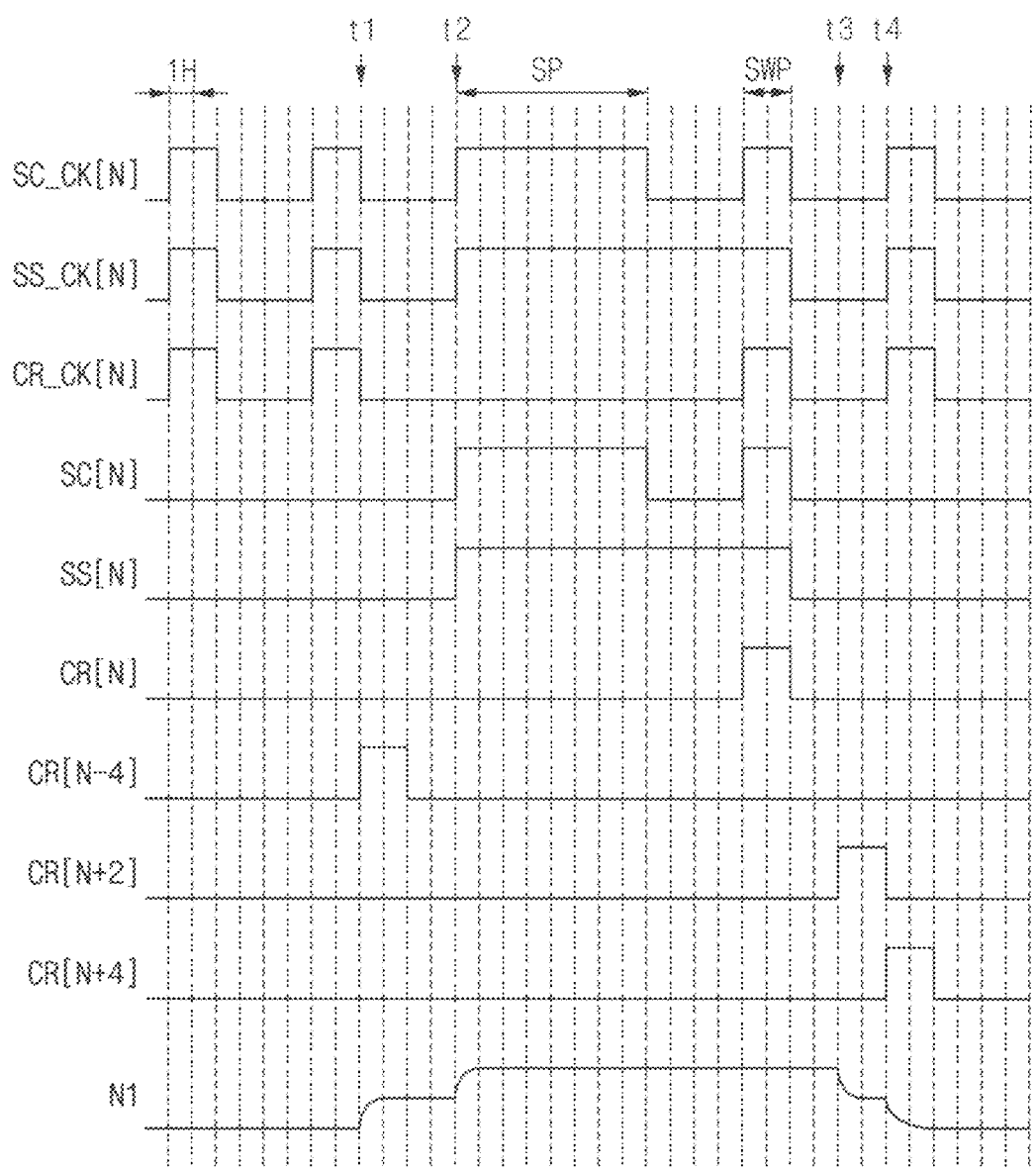
FIG. 8 is a timing diagram illustrating an embodiment in which a stage of the display device of FIG. 1 operates.

FIG. 7 is a diagram illustrating an embodiment of the stage STAGE[N] of the display device 1000 of FIG. 1, and FIG. 8 is a timing diagram illustrating an embodiment in which the stage STAGE[N] of the display device 1000 of FIG. 1 operates. FIGS. 7 and 8 shows the gate-on level as the high voltage level and the gate-off level as the low voltage level. Hereinafter, it is assumed that the N-th pixel line is selected (i.e., the N-th stage STAGE[N] applies the scan signal SC[N] and the sensing signal SS[N] to the selected pixels), and description will be made based on the N-th stage STAGE[N].

Referring to FIGS. 1, 7, and 8, the N-th stage STAGE[N] among the stages may generate the scan signal SC[N] and the sensing signal SS[N] applied to the selected pixels, in the sensing period SP in which the selected pixels are sensed, the scan clock signal SC_CK[N] applied to the N-th stage STAGE[N] and the sensing clock signal SS_CK[N] applied to the N-th stage STAGE[N] may have the gate-on level, and the carry clock signal CR_CK[N] applied to the N-th stage STAGE[N] may have the gate-off level, and, in the sensing pixel data writing period SWP in which the data voltages are applied to the selected pixels, the scan clock signal SC_CK[N] applied to the N-th stage STAGE[N], the sensing clock signal SS_CK[N] applied to the N-th stage STAGE[N], and the carry clock signal CR_CK[N] applied to the N-th stage STAGE[N] may have the gate-on level.

In an embodiment, the stage STAGE[N] may include a first input part 311 controlling a voltage of a third node N3 in response to a previous carry signal CR[N−4], a second input part 312 controlling the voltage of the third node N3 in response to a first next carry signal CR[N+4], a first output part 321 outputting the carry signal CR[N] in response to the voltage of the third node N3, a second output part 322 outputting the scan signal SC[N] in response to the voltage of the third node N3, and a third output part 323 outputting the sensing signal SS[N] in response to the voltage of the third node N3, for example. In an embodiment, the stage STAGE[N] may include a scan signal control part 331 applying the first low power voltage VSS1 to an output terminal of the second output part 322 to which the scan signal SC[N] is output in response to a second next carry signal CR[N+2] in which a pulse is generated before the first next carry signal CR[N+4]. In an embodiment, the stage STAGE[N] may include a sensing signal control part 332 applying the first low power voltage VSS1 to the output terminal of the third output part 323 to which the sensing signal SS[N] is output in response to the second next carry signal CR[N+2].

In an embodiment, the scan signal control part 331 may include a (1-1)-th transistor T1-1 including a control electrode receiving the second next carry signal CR[N+2], a first electrode receiving the first low power voltage VSS1, and a second electrode connected to the output terminal of the second output part 322, for example. The sensing signal control part 332 may include a (1-2)-th transistor T1-2 including a control electrode receiving the second next carry signal CR[N+2], a first electrode receiving the first low power voltage VSS1, and a second electrode connected to the output terminal of the third output part 323.

In an embodiment, the first output part 321 may include a 2-1th transistor T2-1 including a control electrode connected to the third node N3, a first electrode receiving the carry clock signal CR_CK[N], and a second electrode connected to an output terminal of the first output part 321, and a 2-2th transistor T2-2 including a control electrode connected to a fourth node N4, a first electrode receiving the second low power voltage VS S2, and a second electrode connected to the output terminal of the first output part 321, for example.

In an embodiment, the second output part 322 may include a 3-1th transistor T3-1 including a control electrode connected to the third node N3, a first electrode receive the scan clock signal SC_CK[N], and a second electrode connected to the output terminal of the second output part 322, and a 3-2th transistor T3-2 including a control electrode connected to the fourth node N4, a first electrode receiving the first low power voltage VSS1, and a second electrode connected to the output terminal of the second output part 322, for example. In an embodiment, the second output part 322 may further include a first capacitor C1 including a first electrode connected to the third node N3 and a second electrode connected to the output terminal of the second output part 322, for example.

In an embodiment, the third output part 323 may include a 4-1th transistor T4-1 including a control electrode connected to the third node N3, a first electrode receiving the sensing clock signal SS_CK[N], and a second electrode connected to an output terminal of the third output part 323, and a 4-2th transistor T4-2 including a control electrode connected to the fourth node N4, a first electrode receiving the first low power voltage VSS1, and a second electrode connected to the output terminal of the third output part 323, for example. In an embodiment, the third output part 323 may further include a second capacitor C2 including a first electrode connected to the third node N3 and a second electrode connected to the output terminal of the third output part 323, for example.

In an embodiment, the first input part 311 may include a 5–1th transistor T5-1 including a control electrode receiving the previous carry signal CR[N−4], a first electrode receiving the previous carry signal CR[N−4], and a second electrode connected to a fifth node N5, and a 5-2th transistor T5-2 including a control electrode receiving the previous carry signal CR[N−4], a first electrode connected to the fifth node N5, and a second electrode connected to the third node N3, for example.

In an embodiment, the second input part 312 may include a 6-1th transistor T6-1 including a control electrode receiving the first next carry signal CR[N+4], a first electrode connected to the fifth node N5, and a second electrode connected to the third node N3, and a 6-2th transistor T6-2 including a control electrode receiving the first next carry signal CR[N+4], a first electrode receiving a second low power voltage VSS2, and a second electrode connected to the fifth node N5, for example.

In an embodiment, the stage STAGE[N] may further include a first control part 341 controlling a voltage of the fourth node N4 in response to the voltage of the third node N3, a second control part 342 controlling the voltage of the third node N3 in response to the voltage of the fourth node N4, and a third control part 343 controlling the voltage of the fourth node N4 in response to the previous carry signal CR[N−4]. In an embodiment, the stage STAGE[N] may further include a fourth control part 344 controlling the voltage of the third node N3 in response to the start signal STV.

In an embodiment, the first control part 341 may include a 7-1th transistor T7-1 including a control electrode receiving a first scan control signal S1, a first electrode receiving the first scan control signal S1, and a second electrode connected to a first electrode of a 7-2th transistor T7-2, the 7-2th transistor T7-2 including a control electrode receiving the first scan control signal S1, the first electrode connected to the second electrode of the 7-1th transistor T7-1, and a second electrode connected to a sixth node N6, an eighth transistor T8 including a control electrode connected to the sixth node N6, a first electrode receiving the first scan control signal S1, and a second electrode connected to the fourth node N4, a ninth transistor T9 including a control electrode connected to the third node N3, a first electrode receiving the third low power voltage VSS3, and a second electrode connected to the sixth node N6, and a tenth transistor T10 including a control electrode connected to the third node N3, a first electrode receiving the second low power voltage VSS2, and a second electrode connected to the fourth node N4, for example.

In an embodiment, the second control part 342 may include an 11-1th transistor T11-1 including a control electrode connected to the fourth node N4, a first electrode connected to the fifth node N5, and a second electrode connected to the third node N3, and an 11-2th transistor T11-2 including a control electrode connected to the fourth node N4, a first electrode receiving the second low power voltage VSS2, and a second electrode connected to the fifth node N5, for example.

In an embodiment, the third control part 343 may include a twelfth transistor T12 including a control electrode receiving the previous carry signal CR[N−4], a first electrode receiving the second low power voltage VSS2, and a second electrode connected to the fourth node N4, for example.

In an embodiment, the fourth control part 344 may include a 13-1th transistor T13-1 including a control electrode receiving the start signal STV, a first electrode connected to the fifth node N5, and a second electrode connected to the third node N3, and a 13-2th transistor T13-2 including a control electrode receiving the start signal STV, a first electrode receiving the second low power voltage VSS2, and a second electrode connected to the fifth node N5, for example.

In an embodiment, the stage STAGE[N] may further include a leakage control part 350 applying a second scan control signal S2 to the fifth node N5 in response to the voltage of the third node N3.

In an embodiment, the leakage control part 350 may include a 14-1th transistor T14-1 including a control electrode connected to the third node N3, a first electrode receiving the second scan control signal S2, and a second electrode connected to the first electrode of a 14-2th transistor T14-2, and the 14-2th transistor T14-2 including a control electrode connected to the third node N3, the first electrode connected to the second electrode of the 14-1th transistor T14-1, and a second electrode connected to the fifth node N5, for example.

In an embodiment, transistors included in the stage STAGE[N] may be n-type transistors. Accordingly, the gate-on level may be the high voltage level, and the gate-off level may be the low voltage level. However, the inventive concept is not limited thereto. In an embodiment, the transistors included in the stage STAGE[N] may be p-type transistors, for example.

The scan clock signal SC_CK[N], the carry clock signal CR_CK[N] and the sensing clock signal SS_CK[N] may have a pulse of 2 horizontal time every 6 horizontal time. However, the inventive concept is not limited thereto. In an embodiment, the scan clock signal SC_CK[N], the carry clock signal CR_CK[N] and the sensing clock signal SS_CK[N] have a pulse of 1 horizontal time 1H, for example. In an embodiment, the carry clock signal CR_CK[N], the sensing clock signal SS_CK[N], and the scan clock signal SC_CK[N] may have a pulse every 4 horizontal time, for example.

The previous carry signal CR[N−4] may be a carry signal generated in a fourth previous stage than the carry signal CR[N]. That is, a phase of the previous carry signal CR[N−4] may be different from a phase of the carry signal CR[N] by 4 horizontal time. However, the inventive concept is not limited thereto. In an embodiment, the phase of the previous carry signal CR[N−4] may be different from the phase of the carry signal CR[N] by 2 horizontal time, for example.

The first next carry signal CR[N+4] may be a carry signal generated in a fourth next stage than the carry signal CR[N]. That is, the phase of the first next carry signal CR[N+4] may be different from the phase of the carry signal CR[N] by 4 horizontal time. However, the inventive concept is not limited thereto. In an embodiment, the phase of the first next carry signal CR[N+4] may be different from the phase of the carry signal CR[N] by 2 horizontal time, for example.

The second next carry signal CR[N+2] may be a carry signal generated in a second previous stage than the first next carry signal CR[N+4]. That is, the phase of the second next carry signal CR[N+2] may be different from the phase of the first next carry signal CR[N+4] by 2 horizontal time. However, the inventive concept is not limited thereto. In an embodiment, the phase of the second next carry signal CR[N+2] may be different from the phase of the first next carry signal CR[N+4] by 1 horizontal time, for example.

In an embodiment, the start signal STV may have the gate-on level when a scan operation (i.e., an operation of applying the gate signals to the pixels P) starts in one frame, for example. Accordingly, the start signal STV may be used as the previous carry signal CR[N−4] of the first stage (STAGE[1] in FIG. 3). Also, the fourth control part 344 may apply the second low power voltage VSS2 to the third node N3 in response to the start signal STV. Accordingly, when the scan operation starts, the gate driver 300 may discharge the voltage of the third node N3 of all stages.

Hereinafter, an operation of the stage STAGE[N] will be described.

At a first time point t1, the previous carry signal CR[N−4] may have the gate-on level, and the first input part 311 may apply the previous carry signal CR[N−4] of the gate-on level to the third node N3. Accordingly, the voltage of the third node N3 may increase. In addition, the voltage of the fourth node N4 may be decreased by the first control part 341, the second control part 342, and the third control part 343.

At a second time point t2, the carry clock signal CR_CK[N], the scan clock signal SC_CK[N], and the sensing clock signal SS_CK[N] may have the gate-on level. As the scan clock signal SC_CK[N] and the sensing clock signal SS_CK[N] increase from the gate-off level to the gate-on level, a voltage of the second electrode of the first capacitor C1 and a voltage of the second electrode of the second capacitor C2 may increase. Accordingly, the voltage of the third node N3 may further increase. And, the stage STAGE[N] may output the carry clock signal CR_CK[N] having the gate-on level, the scan clock signal SC_CK[N] having the gate-on level, and the sensing clock signal SS_CK[N] having the gate-on level as the carry signal CR [N], the scan signal SC[N], and the sensing signal SS[N].

At a third time point t3, the second next carry signal CR[N+2] may have the gate-on level, the scan signal control part 331 may apply the first low power voltage VSS1 to the output terminal of the second output part 322, and the sensing signal control part 332 may apply the first low power voltage VSS1 to the output terminal of the third output part 323. Accordingly, a falling time of the scan signal SC[N] and a falling time of the sensing signal SS[N] may be reduced. However, FIG. 5 does not illustrate the falling time of signals. In an embodiment, the falling time may be the time for a signal to go from the gate-on level to the gate-off level, for example.

At a fourth time t4, the first next carry signal CR[N+4] may have the gate-on level, and the second low power voltage VSS2 may be applied to the third node N3. Accordingly, the voltage of the third node N3 may decrease.

In an embodiment, the first scan control signal S1 may be the gate-on voltage. The first scan control signal S1 may be applied to the fourth node N4 when the voltage of the third node N3 is the gate-off level. Accordingly, when the voltage of the third node N3 is the gate-off level, the voltage of the fourth node N4 may be the gate-on level.

In an embodiment, the second scan control signal S2 may be the gate-on voltage. The second scan control signal S2 may reduce leakage currents of the second input part 312, the second control part 342, and the fourth control part 344 when the voltage of the third node N3 is the gate-on level.

In an embodiment, when the voltage of the control electrode of the 6-1th transistor T6-1 is the gate-on level, a gate-source voltage of the 6-1th transistor T6-1 may be reduced, for example. Accordingly, a leakage current flowing through the 6-1th transistor T6-1 may be reduced. This may be the same in the 11-1th transistor T11-1 and the 13-1th transistor T13-1.

In an embodiment, the first low power voltage VSS1 may be greater than the second low power voltage VSS2. In an embodiment, the third low power voltage VSS3 may be the same as the first low power voltage VSS1.

In contrast, when the display device performs the data write operation (i.e., an initial data write operation) on the selected pixels in the first period (P1 in FIG. 5), and perform the sensing operation on the selected pixels in the second period (P2 in FIG. 5), a sensing circuit for generating the scan signal SC[N] and the sensing signal SS[N] in the second period (P2 in FIG. 5) may be desired for the gate driver.

However, since the gate driver 300 generates the scan signal SC[N] and the sensing signal SS[N] for sensing on the selected pixels without a separate sensing circuit, the display device 1000 according to the inventive concept may reduce dead space and reduce cost.

Figure 9:
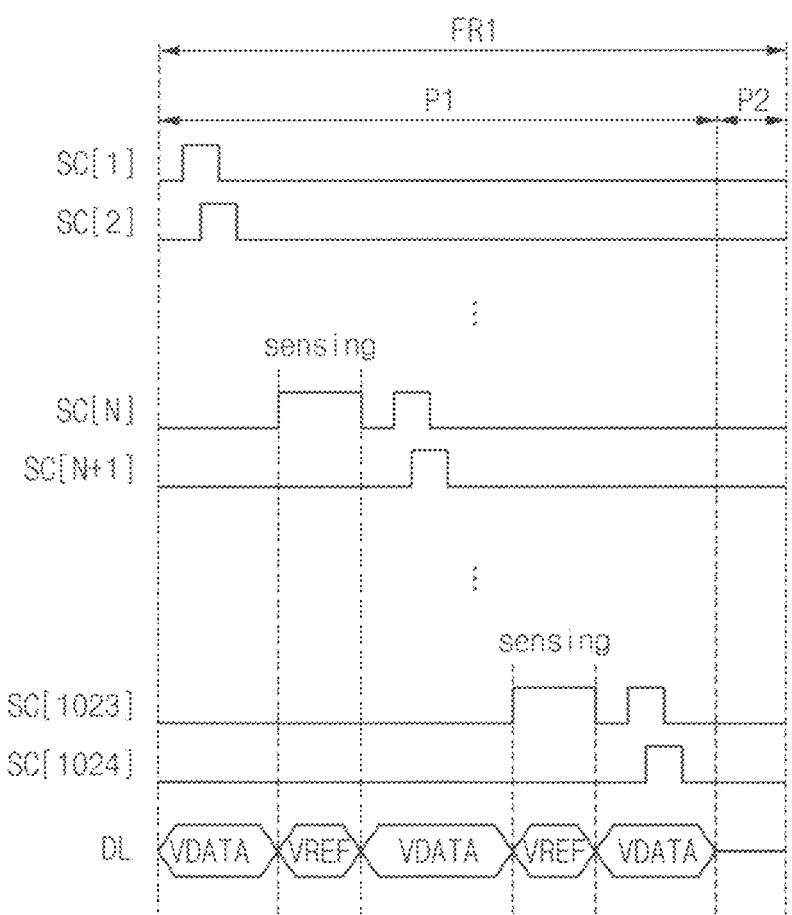
FIG. 9 is a timing diagram illustrating an embodiment in which the display device of FIG. 1 senses a plurality of pixel lines.

FIG. 9 is a timing diagram illustrating an embodiment in which the display device 1000 of FIG. 1 senses a plurality of pixel lines.

Referring to FIG. 9, the display device 1000 may select a plurality of the pixel lines, senses the pixels P of the selected pixel lines, apply the data voltages VDATA to the selected pixels after the selected pixels are sensed in one frame FR1.

In contrast, when the display device performs the data write operation (i.e., an initial data write operation) on the selected pixels in the first period (P1 in FIG. 5), and perform the sensing operation on the selected pixels in the second period (P2 in FIG. 5), a sensing circuit for generating the scan signal SC[N] and the sensing signal SS[N] in the second period (P2 in FIG. 5) may be desired for the gate driver. Also, it may be difficult to sense two or more pixel lines in one frame FR1 due to a limitation of the circuit configuration.

However, since the gate driver 300 generates the scan signal SC[N] and the sensing signal SS[N] for sensing on the selected pixels without a separate sensing circuit, the display device 1000 according to the inventive concept may sense the plurality of the pixel lines (especially, non-adjacent pixel lines).

Figure 10:
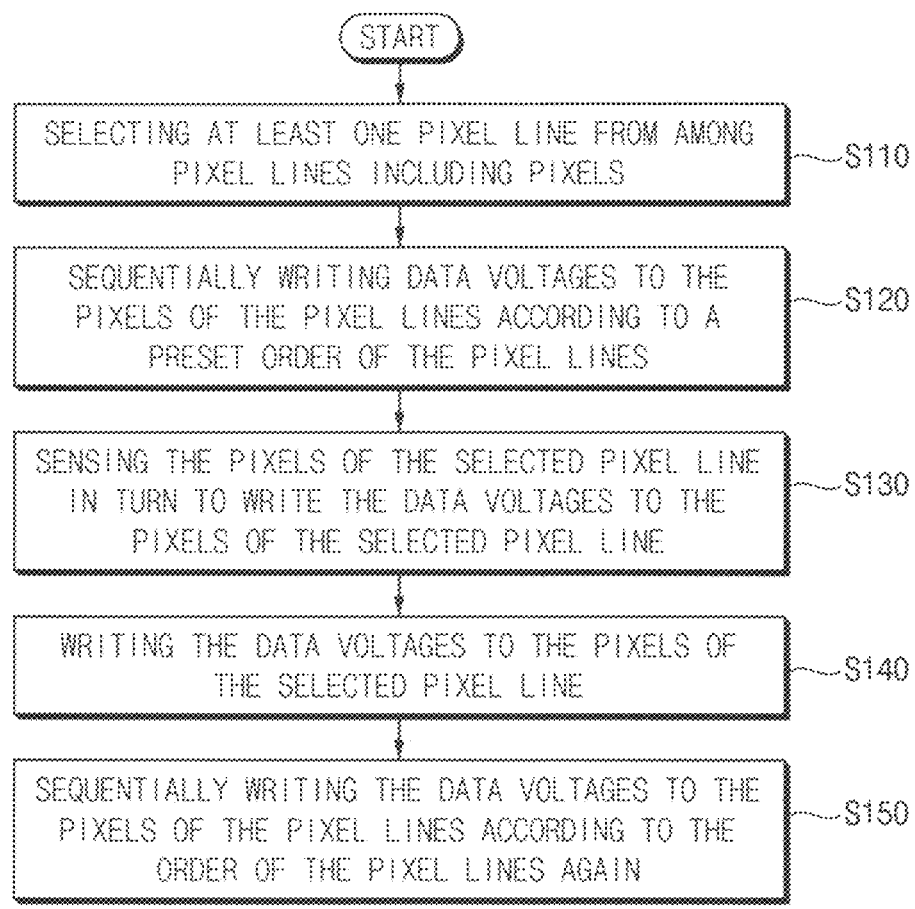
FIG. 10 is a flowchart illustrating an embodiment of a method of driving a display device.

FIG. 10 is a flowchart illustrating an embodiment of a method of driving a display device.

Referring to FIG. 10, the method of FIG. 10 may select at least one pixel line from among pixel lines including pixels (S110), sequentially write data voltages to the pixels of the pixel lines according to a preset order of the pixel lines (S120), sense the pixels of the selected pixel line in turn to write the data voltages to the pixels of the selected pixel line (S130), writing the data voltages to the pixels of the selected pixel line (S140), and sequentially writing the data voltages to the pixels of the pixel lines according to the order of the pixel lines again (S150).

Specifically, the method of FIG. 10 may select at least one pixel line from among pixel lines including pixels (S110). That is, in the method of FIG. 10, a pixel line on which the sensing operation is to be performed may be selected from among the pixel lines.

Specifically, the method of FIG. 10 may sequentially write data voltages to the pixels of the pixel lines according to a preset order of the pixel lines (S120), sense the pixels of the selected pixel line in turn to write the data voltages to the pixels of the selected pixel line (S130), writing the data voltages to the pixels of the selected pixel line (S140), and sequentially writing the data voltages to the pixels of the pixel lines according to the order of the pixel lines again (S150). The data voltages may be not apply to the pixels of the selected pixels line before the pixels of the selected pixel line are sensed in one frame. In an embodiment, the pixel lines may be pixel rows, and the preset order may be from an upper pixel row to a lower pixel row, for example.

In an embodiment, when the selected pixel line is a N-th pixel line, the method of FIG. 10 may sequentially write the data voltages up to a N−1th pixel line, for example. Next, the method of FIG. 10 may sense the pixels of the N-th pixel line. After the pixels of the N-th pixel line are sensed, the method of FIG. 10 may write the data voltages in the N-th pixel line. After the data voltages may be written to the N-th pixel line, and the method of FIG. 10 may sequentially write the data voltages from a N+1-th pixel line. Since the data writing operation and the sensing operation have been described with reference to FIGS. 2 to 4, a redundant description thereof will be omitted.

Figure 11:
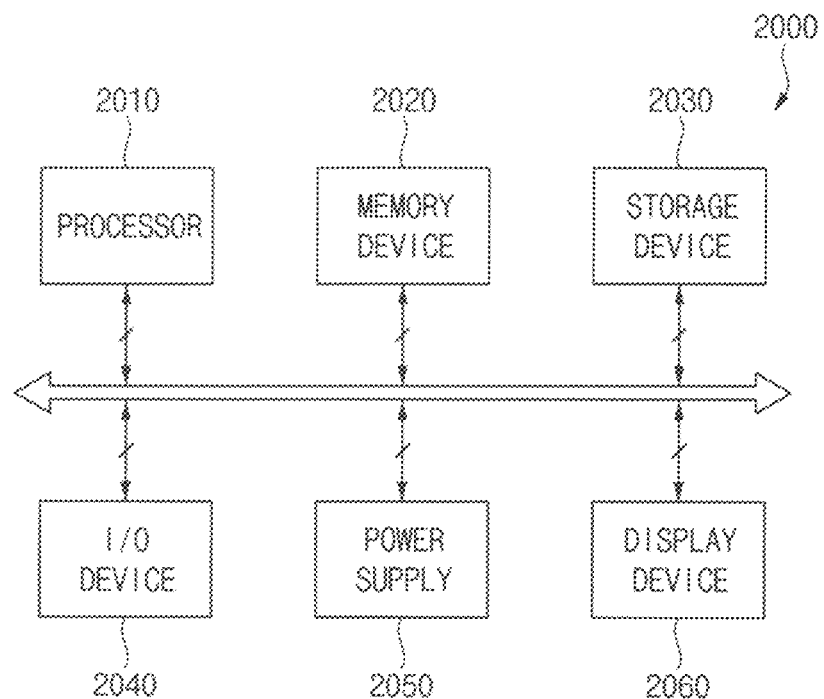
FIG. 11 is a block diagram showing an embodiment of an electronic device according to the inventive concept.
Figure 12:
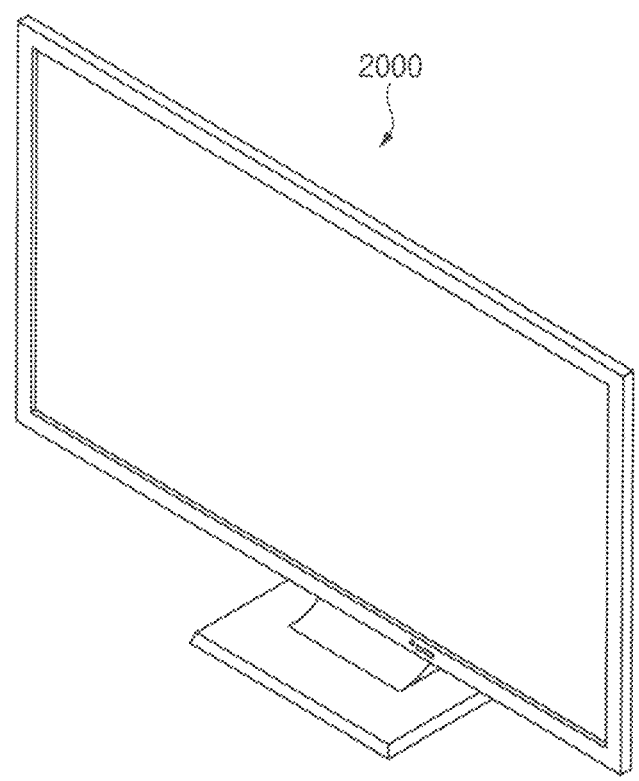
FIG. 12 is a diagram showing an embodiment in which the electronic device of FIG. 11 is implemented as a television.

FIG. 11 is a block diagram showing an electronic device in embodiments of the inventive concept, and FIG. 12 is a diagram showing an embodiment in which the electronic device of FIG. 11 is implemented as a television.

Referring to FIGS. 11 and 12, the electronic device 2000 may include a processor 2010, a memory device 2020, a storage device 2030, an input/output ("I/O") device 2040, a power supply 2050, and a display device 2060. Here, the display device 2060 may be the display device 1000 of FIG. 1. In addition, the electronic device 2000 may further include a plurality of ports for communicating with a video card, a sound card, a memory card, a universal serial bus ("USB") device, other electronic devices, etc. In an embodiment, as shown in FIG. 12, the electronic device 2000 may be implemented as a television. However, the electronic device 2000 is not limited thereto. In an embodiment, the electronic device 2000 may be implemented as a cellular phone, a video phone, a smart pad, a smart watch, a tablet personal computer ("PC"), a car navigation system, a computer monitor, a laptop, a head mounted display ("HMD") device, etc., for example.

The processor 2010 may perform various computing functions. The processor 2010 may be a microprocessor, a central processing unit ("CPU"), an application processor ("AP"), etc. The processor 2010 may be coupled to other components via an address bus, a control bus, a data bus, etc. Further, the processor 2010 may be coupled to an extended bus such as a peripheral component interconnection ("PCI") bus.

The memory device 2020 may store data for operations of the electronic device 2000. In an embodiment, the memory device 2020 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and/or at least one volatile memory device such as a dynamic random access memory ("DRAM") device, a static random access memory ("SRAM") device, a mobile DRAM device, etc., for example.

The storage device 2030 may include a solid state drive ("SSD") device, a hard disk drive ("HDD") device, a compact disc read-only memory ("CD-ROM") device, etc.

The I/O device 2040 may include an input device such as a keyboard, a keypad, a mouse device, a touch pad, a touch screen, etc., and an output device such as a printer, a speaker, etc. In some embodiments, the I/O device 2040 may include the display device 2060.

The power supply 2050 may provide power for operations of the electronic device 2000. In an embodiment, the power supply 2050 may be a power management integrated circuit ("PMIC"), for example.

The display device 2060 may display an image corresponding to visual information of the electronic device 2000. In an embodiment, the display device 2060 may be an organic light-emitting display device or a quantum dot light-emitting display device, for example, but is not limited thereto. The display device 2060 may be coupled to other components via the buses or other communication links.

The inventive concepts may be applied to any electronic device including the display device. In an embodiment, the inventive concepts may be applied to a television ("TV"), a digital TV, a three dimensional ("3D") TV, a mobile phone, a smart phone, a tablet computer, a virtual reality ("VR") device, a wearable electronic device, a personal computer ("PC"), a home appliance, a laptop computer, a personal digital assistant ("PDA"), a portable multimedia player ("PMP"), a digital camera, a music player, a portable game console, a navigation device, etc., for example.

The foregoing is illustrative of the inventive concept and is not to be construed as limiting thereof. Although a few embodiments of the inventive concept have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the predetermined embodiments disclosed, and that modifications to the disclosed embodiments, as well as other embodiments, are intended to be included within the scope of the appended claims. The inventive concept is defined by the following claims, with equivalents of the claims to be included therein.

What is claimed is:

1. A display device comprising:
    a display panel including pixels;
    a gate driver which applies gate signals to the pixels sequentially during a first period of one frame;
    a data driver which applies data voltages to the pixels, senses selected pixels among the pixels during the first period and before a gate signal of the selected pixels among the gate signals is applied, and applies the data voltages to the selected pixels after the selected pixels are sensed in the one frame; and
    a timing controller which controls the gate driver and the data driver,
    wherein the gate signals include a scan signal and a sensing signal,
    each of the pixels includes:
        a driving transistor including a control electrode connected to a first node, a first electrode which receives a first power voltage, and a second electrode connected to a second node;
        a first transistor including a control electrode which receives the scan signal, a first electrode connected to a data line, and a second electrode connected to the first node; and
        a second transistor including a control electrode which receives the sensing signal, a first electrode connected to the second node, and a second electrode connected to a sensing line, and
    the sensing signal has a turn-on start point identical to a turn-on start point of the scan signal, and the sensing signal has a turn-on period length different from a turn-on period length of the scan signal during the first period.

2. The display device of claim 1, wherein the data driver does not apply the data voltages to the selected pixels before the selected pixels are sensed in the one frame.

3. The display device of claim 1, wherein, in the first period of the one frame, the data driver applies the data voltages to the pixels, senses the selected pixels, and applies the data voltages to the selected pixels after the selected pixels are sensed, and
    wherein, in a second period of the one frame after the first period, the data driver does not apply the data voltages to the pixels.

4. The display device of claim 1, wherein the data driver applies a reference voltage to the selected pixels, generates sensing currents in the selected pixels, receives the sensing currents, and senses the selected pixels.

5. The display device of claim 4, wherein
    each of the pixels further includes:
        a storage capacitor including a first electrode connected to the first node and a second electrode connected to the second node; and a light-emitting element including a first electrode connected to the second node and a second electrode which receives a second power voltage.

6. The display device of claim 5, wherein, in the sensing period in which the selected pixels are sensed, the scan signal and the sensing signal have a gate-on level, and the reference voltage is applied to the data line, and
wherein, in the sensing pixel data writing period in which the data voltages are applied to the selected pixels, the scan signal and the sensing signal have the gate-on level, and the data voltages are applied to the data line.

7. The display device of claim 1,
wherein the gate driver includes a plurality of stages, and
wherein each of the plurality of stages outputs a carry clock signal as a carry signal in response to a previous carry signal, outputs a scan clock signal as the scan signal in response to the previous carry signal, and outputs a sensing clock signal as the sensing signal in response to the previous carry signal.

8. The display device of claim 7, wherein a N-th stage, where N is a positive integer, among the stages, generates the scan signal and the sensing signal applied to the selected pixels,
wherein, in a sensing period in which the selected pixels are sensed, the scan clock signal applied to the N-th stage and the sensing clock signal applied to the N-th stage have a gate-on level, and the carry clock signal applied to the N-th stage has a gate-off level, and
wherein, in a sensing pixel data writing period in which the data voltages are applied to the selected pixels, the scan clock signal applied to the N-th stage, the sensing clock signal applied to the N-th stage, and the carry clock signal applied to the N-th stage have the gate-on level.

9. The display device of claim 8, wherein each of the plurality of stages includes:
a first input part which controls a voltage of a third node in response to the previous carry signal;
a second input part which controls the voltage of the third node in response to a first next carry signal;
a first output part which outputs the carry clock signal as the carry signal in response to the voltage of the third node;
a second output part which outputs the scan clock signal as the scan signal in response to the voltage of the third node; and
a third output part which outputs the sensing clock signal as the sensing signal in response to the voltage of the third node.

10. A display device comprising:
a display panel including pixels;
a gate driver which applies gate signals to the pixels sequentially during a first period of one frame;
a data driver which applies data voltages to the pixels, senses the pixels of a selected pixel line among pixel lines including the pixels during the first period and before a gate signal of the selected pixels among the gate signals is applied, and applies the data voltages to the pixels of the selected pixel line after the pixels of the selected pixel line are sensed in the one frame; and
a timing controller which controls the gate driver and the data driver,
wherein the gate signals include a scan signal and a sensing signal, each of the pixels includes:
a driving transistor including a control electrode connected to a first node, a first electrode which receives a first power voltage, and a second electrode connected to a second node;
a first transistor including a control electrode which receives the scan signal, a first electrode connected to a data line, and a second electrode connected to the first node; and
a second transistor including a control electrode which receives the sensing signal, a first electrode connected to the second node, and a second electrode connected to a sensing line, and
the sensing signal has a turn-on start point identical to a turn-on start point of the scan signal, and the sensing signal has a turn-on period length different from a turn-on period length of the scan signal during the first period.

11. The display device of claim 10, wherein the data driver does not apply the data voltages to the pixels of the selected pixel line before the pixels of the selected pixel line are sensed in the one frame.

12. The display device of claim 10, wherein, in the first period of the one frame, the data driver applies the data voltages to the pixels, senses the pixels of the selected pixel line, and applies the data voltages to the pixels of the selected pixel line after the pixels of the selected pixel line are sensed, and
wherein, in a second period of the one frame after the first period, the data driver does not apply the data voltages to the pixels.

13. The display device of claim 10, wherein the data driver applies a reference voltage to the pixels of the selected pixel line, generates sensing currents in the pixels of the selected pixel line, receives the sensing currents, and senses the pixels of the selected pixel line.

14. The display device of claim 13,
wherein each of the pixels further includes:
a storage capacitor including a first electrode connected to the first node and a second electrode connected to the second node; and
a light-emitting element including a first electrode connected to the second node and a second electrode which receives a second power voltage.

15. The display device of claim 14, wherein, in a sensing period in which the pixels of the selected pixel line are sensed, the scan signal and the sensing signal have a gate-on level, and the reference voltage is applied to the data line, and
wherein, in a sensing pixel data writing period in which the data voltages are applied to the pixels of the selected pixel line, the scan signal and the sensing signal have the gate-on level, and the data voltages are applied to the data line.

16. The display device of claim 10,
wherein the gate driver includes a plurality of stages, and
wherein each of the plurality of stages outputs a carry clock signal as a carry signal in response to a previous carry signal, outputs a scan clock signal as the scan signal in response to the previous carry signal, and outputs a sensing clock signal as the sensing signal in response to the previous carry signal.

17. The display device of claim 16, wherein a N-th stage, where N is a positive integer, among the plurality of stages generates the scan signal and the sensing signal applied to the pixels of the selected pixel line, wherein, in a sensing period in which the pixels of the selected pixel line are sensed, the scan clock signal applied to the N-th stage and the sensing clock signal applied to the N-th stage have a gate-on level, and the carry clock signal applied to the N-th stage has a gate-off level, and wherein, in a sensing pixel data writing period in which the data voltages are applied to the pixels of the selected pixel line, the scan clock signal applied to the N-th stage, the sensing clock signal applied to the N-th stage, and the carry clock signal applied to the N-th stage have the gate-on level.

18. The display device of claim 16, wherein each of the plurality of stages includes:

a first input part which controls a voltage of a third node in response to the previous carry signal;

a second input part which controls the voltage of the third node in response to a first next carry signal;

a first output part which outputs the carry clock signal as the carry signal in response to the voltage of the third node;

a second output part which outputs the scan clock signal as the scan signal in response to the voltage of the third node; and a third output part which outputs the sensing clock signal as the sensing signal in response to the voltage of the third node.

19. A method of driving a display device, the method comprising:

selecting a pixel line from among pixel lines including pixels;

sequentially writing data voltages to the pixels of the pixel lines according to a preset order of the pixel lines during a first period of one frame;

sensing the pixels of a selected pixel line in turn to write the data voltages to the pixels of the selected pixel line during the first period and before a gate signal of the selected pixels among the gate signals is applied;

writing the data voltages to the pixels of the selected pixel line; and sequentially writing the data voltages to the pixels of the pixel lines according to the preset order of the pixel lines again, wherein the gate signals include a scan signal and a sensing signal, each of the pixels includes:

a driving transistor including a control electrode connected to a first node, a first electrode which receives a first power voltage, and a second electrode connected to a second node;

a first transistor including a control electrode which receives the scan signal, a first electrode connected to a data line, and a second electrode connected to the first node; and a second transistor including a control electrode which receives the sensing signal, a first electrode connected to the second node, and a second electrode connected to a sensing line, and the sensing signal has a turn-on start point identical to a turn-on start point of the scan signal, and the sensing signal has a turn-on period length different from a turn-on period length of the scan signal during the first period.

20. The method of claim 19, wherein the data voltages is not applied to the pixels of the selected pixels line before the pixels of the selected pixel line are sensed in the one frame.

* * * * *